(12) United States Patent
Ki et al.

(10) Patent No.: US 7,065,735 B2
(45) Date of Patent: Jun. 20, 2006

(54) METHOD FOR MAKING AN OPC MASK AND AN OPC MASK MANUFACTURED USING THE SAME

(75) Inventors: Won-Tai Ki, Kyungki-do (KR); Seong-Woon Choi, Kyungki-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 15 days.

(21) Appl. No.: 10/401,856

(22) Filed: Mar. 27, 2003

(65) Prior Publication Data

US 2003/0226130 A1  Dec. 4, 2003

(30) Foreign Application Priority Data

Jun. 4, 2002  (KR) .......................... 2002-0031405

(51) Int. Cl.
*G06F 17/50* (2006.01)

(52) U.S. Cl. .................................................. 716/19

(58) Field of Classification Search ............ 716/19–21; 430/5, 30, 256, 313, 315, 3, 396, 942
See application file for complete search history.

(56) References Cited

U.S. PATENT DOCUMENTS

| | | | | |
|---|---|---|---|---|
| 5,213,916 A | * | 5/1993 | Cronin et al. .................. | 430/5 |
| 5,884,242 A | * | 3/1999 | Meier et al. ................. | 702/179 |
| 6,051,344 A | * | 4/2000 | Langston et al. .............. | 430/5 |
| 6,215,546 B1 | * | 4/2001 | Chu et al. ..................... | 355/52 |
| 6,316,163 B1 | * | 11/2001 | Magoshi et al. ............ | 430/296 |
| 6,544,700 B1 | * | 4/2003 | Ogino ......................... | 430/30 |
| 6,656,753 B1 | * | 12/2003 | Lin ............................. | 438/14 |
| 2002/0028398 A1 | * | 3/2002 | Ogino ......................... | 430/30 |
| 2003/0152873 A1 | * | 8/2003 | Tainaka et al. ............. | 430/313 |
| 2004/0133369 A1 | * | 7/2004 | Pack et al. .................... | 702/59 |

* cited by examiner

*Primary Examiner*—Vuthe Siek
(74) *Attorney, Agent, or Firm*—Marger Johnson & McCollom, P.C.

(57) ABSTRACT

This disclosure provides a method for manufacturing an optical proximity correction (OPC) mask, the method using an electron beam, and an OPC mask manufactured using the method. In the method, a mask is placed on a holder and a mask pattern for a photolithography process formed on the mask by illuminating the mask with an electron beam. A desired pattern is formed on the mask and an amended pattern is formed in consideration of a Kennel Effect by changing the size of the electron beam in a portion of the desired pattern where the Kennel Effect occurs. With the method, an amended pattern is made by defocusing an electron beam to change the size of the electron beam. Accordingly, an additional large amended pattern file is not required and the CPU memory for an apparatus using this method is not overloaded. This method thereby simplifies the process of manufacturing an OPC mask and complicated amended patterns are easily produced.

22 Claims, 7 Drawing Sheets

(a)

(b)

(a)        (b)        (c)

+  *

(a)        (b)

METHOD FOR MAKING AN OPC MASK AND AN OPC MASK MANUFACTURED USING THE SAME

CROSS REFERENCE TO RELATED APPLICATIONS

This application claims benefit of priority, under 35 USC §119, to Korean Patent Application No. 2002-31405, filed Jun. 4, 2002 in the Korean Intellectual Property Office, the disclosure of which is incorporated herein in its entirety by reference.

BACKGROUND OF THE INVENTION

1. Field of the Invention

The present invention relates to a photo mask used in fabricating a semiconductor device and a method for making the photo mask. More particularly, the invention relates to a method of making an optical proximity correction (OPC) mask using an electron beam and an OPC mask manufactured using the method.

2. Description of the Related Art

In general, photo masks are an indispensable part of forming photoresist patterns. Photoresist patterns are used in the photolithography processes that are required to fabricate semiconductor devices. Such a photo mask is manufactured by forming various figures corresponding to the shape of a variety of integrated circuits on a film coated with a light-shielding material, such that the mask is selectively pervious to light. The use of the photo mask makes it possible to transfer a desired integrated circuit pattern to an exact position of a photoresist during alignment and exposure in a photolithography process.

One drawback of photo masks is that a reduction in the critical dimension of an integrated circuit or in the wavelength of a light source used for exposure results in interference patterns caused by light diffraction. When these interference patterns are present it is difficult to precisely transfer a circuit pattern with the desired critical dimension to the photoresist.

FIGS. 1A and 1B are diagrams illustrating the pattern thinning, or Kennel effect, due to interference of light during exposure. More precisely, the Kennel effect refers to how a linear pattern of a fine critical dimension is affected by the pattern density of peripheral patterns. For example, referring to FIG. 1B, although a photo mask is patterned with a desired critical dimension, when the photo mask is exposed to form a pattern on the photoresist a portion P111 of the photo mask is transferred with the desired critical dimension as shown in (b) but an isolated line pattern P122 is transferred as shown in (a) with a narrower critical dimension than desired.

To counteract the Kennel Effect, optical proximity correction (OPC) techniques have been developed to exactly transfer a pattern of a critical dimension onto a desired position. OPC techniques statistically or experimentally calculate the relationship between a desired pattern and the pattern which will actually be formed on a photoresist after performing alignment and exposure on a photo mask. Based on the calculation result, the size of the photo mask pattern is adjusted to compensate for the pattern thinning effect. As a result, an actual pattern of the desired size is formed on the photoresist. In this disclosure, a pattern made by using the OPC technique to compensate for the Kennel Effect is referred to as an amended pattern.

To compensate for the Kennel Effect in a pattern, a machine-readable file containing the amended pattern must be combined with a machine-readable file that contains the originally desired pattern, thereby forming an adjusted pattern based on the information from both of the files. That is, the desired pattern must be stored together with an additional pattern, i.e., the amended pattern, in one file, thereby substantially increasing the memory required to store the file. It is difficult for an apparatus that manufactures pattern masks with an electron beam to completely store a large capacity file in a memory unit and process the file with its central processing unit (CPU). Thus, much time is spent executing the file.

SUMMARY OF THE INVENTION

To solve these and other problems, it is an aspect of the present invention to provide a method for manufacturing an optical proximity correction (OPC) mask by forming an amended pattern without too greatly expanding the memory required to process the amended pattern file, and an OPC mask manufactured by using the method.

To achieve this and other goals, a method of manufacturing an optical proximity correction (OPC) mask with an electron beam is provided, the method comprising placing a mask on a holder and forming a mask pattern for a photolithography process on the mask by illuminating the mask with an electron beam. In the method, a desired pattern is formed on the mask, and an amended pattern is formed by changing the size of the electron beam in a portion of the desired pattern where the Kennel Effect occurs. Next, an amended pattern of the desired pattern is formed in consideration of the Kennel Effect by changing the size of the electron beam used to form the desired pattern by defocusing the electron beam.

Forming a desired pattern includes placing the mask on the holder, preparing a file that stores information regarding the desired pattern on the mask, and forming the desired pattern on the mask by illuminating the mask with an electron beam according to the information regarding the desired pattern contained in the file. When forming a desired pattern, the electron beam linearly illuminates a portion of the mask where the desired pattern is to be formed. The desired pattern stored in the file is the same as a pattern to be formed on a semiconductor substrate after a photolithography process.

The defocusing of the electron beam adjusts the depth of focus of the electron beam so as to change the diameter, or size, of the electron beam. The size of the electron beam is adjusted by an electron beam focusing unit. A voltage is applied to the electron beam focusing unit to move the focal point of the electron beam.

The size of the electron beam is adjusted by defocusing the electron beam until it equals the critical dimension of a pattern formed in pattern area in which the Kennel Effect occurs. The amended pattern formed in consideration of the Kennel Effect is an isolated linear pattern.

To achieve these and other aspects of the invention, there is also provided an OPC mask for a photolithography process, the OPC mask including a mask body having a plate shape and being coated with a light-shielding layer, a desired pattern formed on the light-shielding layer, and an amended pattern formed by illuminating around the desired pattern with an electron beam in consideration of adjacent pattern interference. The amended pattern is formed by defocusing the electron beam that is used to make the desired pattern.

With this method of manufacturing an OPC mask, it is possible to transfer an OPC pattern without using large files containing amended patterns. Thus, it is possible to easily make an amended pattern in consideration of the Kennel Effect without overloading the memory capacity of an apparatus for manufacturing an OPC mask with an electron beam. Therefore, complicated patterns can be easily formed.

To achieve these and other goals, there is also provided an apparatus for manufacturing an OPC mask with an electron beam, the apparatus including a holder on which a mask body is placed; an electron beam illuminator formed on a central upper portion of the holder, the electron beam illuminator including an electron beam focusing unit focusing a source of electron beam and the electron beam, and an electron beam controlling unit that defocuses the electron beam by changing a depth of focus of the electron beam, the source of electron beam generating the electron beam to illuminate the mask body with the electron beam; and a controller mounted on the electron beam illuminator for calculating the size of the electron beam and controlling the electron beam controlling unit based on the calculation result.

The controller changes the size of the electron beam according to coefficients obtained in consideration of the Kennel Effect while controlling the electron beam controlling unit. The size of the electron beam corresponds to a critical dimension of an amended pattern formed in consideration of the Kennel Effect.

BRIEF DESCRIPTION OF THE DRAWINGS

These and other aspects and advantages of the present invention will become more apparent by describing in detail preferred embodiments thereof with reference to the attached drawings in which:

FIG. 1B is a diagram illustrating a photoresist pattern in which the Kennel Effect is compensated for;

FIG. 3C (b) is a plane view illustrating the sizes of the focused electron beam and the defocused electron beam;

DETAILED DESCRIPTION OF THE INVENTION

Figure 1A:
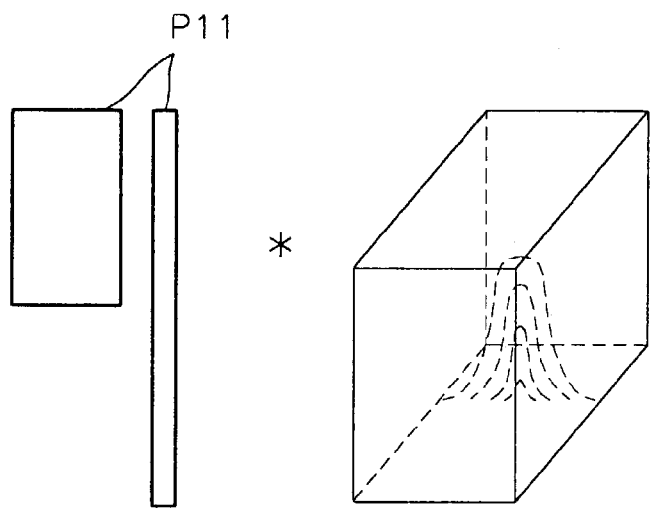
FIG. 1A is a diagram illustrating the Kennel Effect as it affects a desired pattern.
Figure 1B:
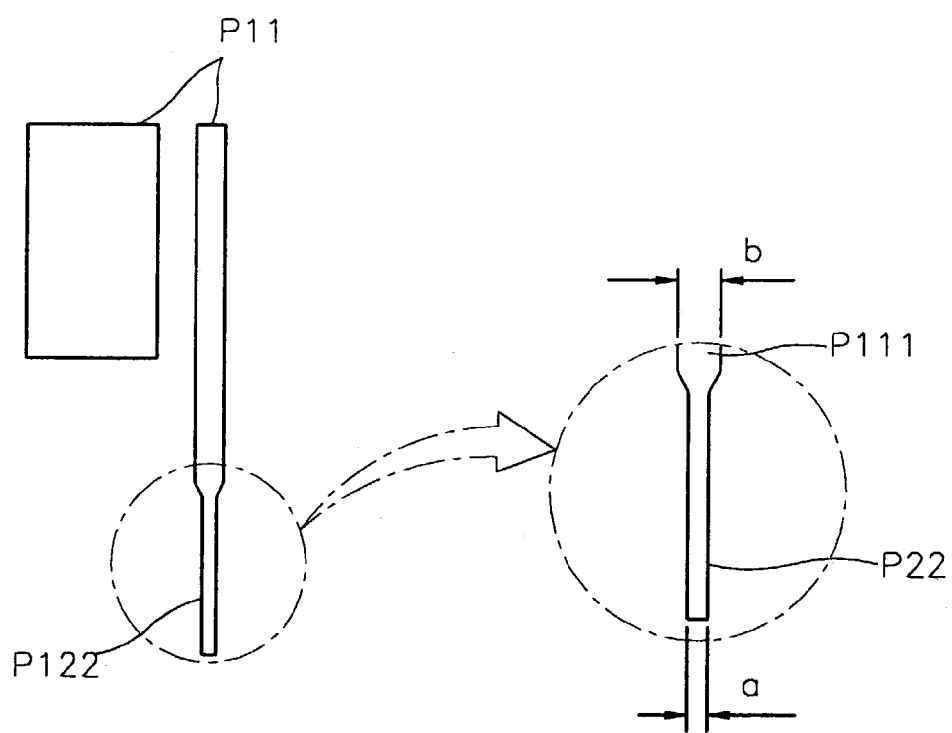

The present invention will now be described more fully with reference to the accompanying drawings, in which a preferred embodiment of the invention is shown. This invention may, however, be embodied in many different forms and should not be construed as being limited to the embodiments set forth herein; rather, these embodiments are provided so that this disclosure will be thorough and complete, and will fully convey the concept of the invention to those skilled in the art. The same reference numerals in different drawings represent the same element.

Figure 2:
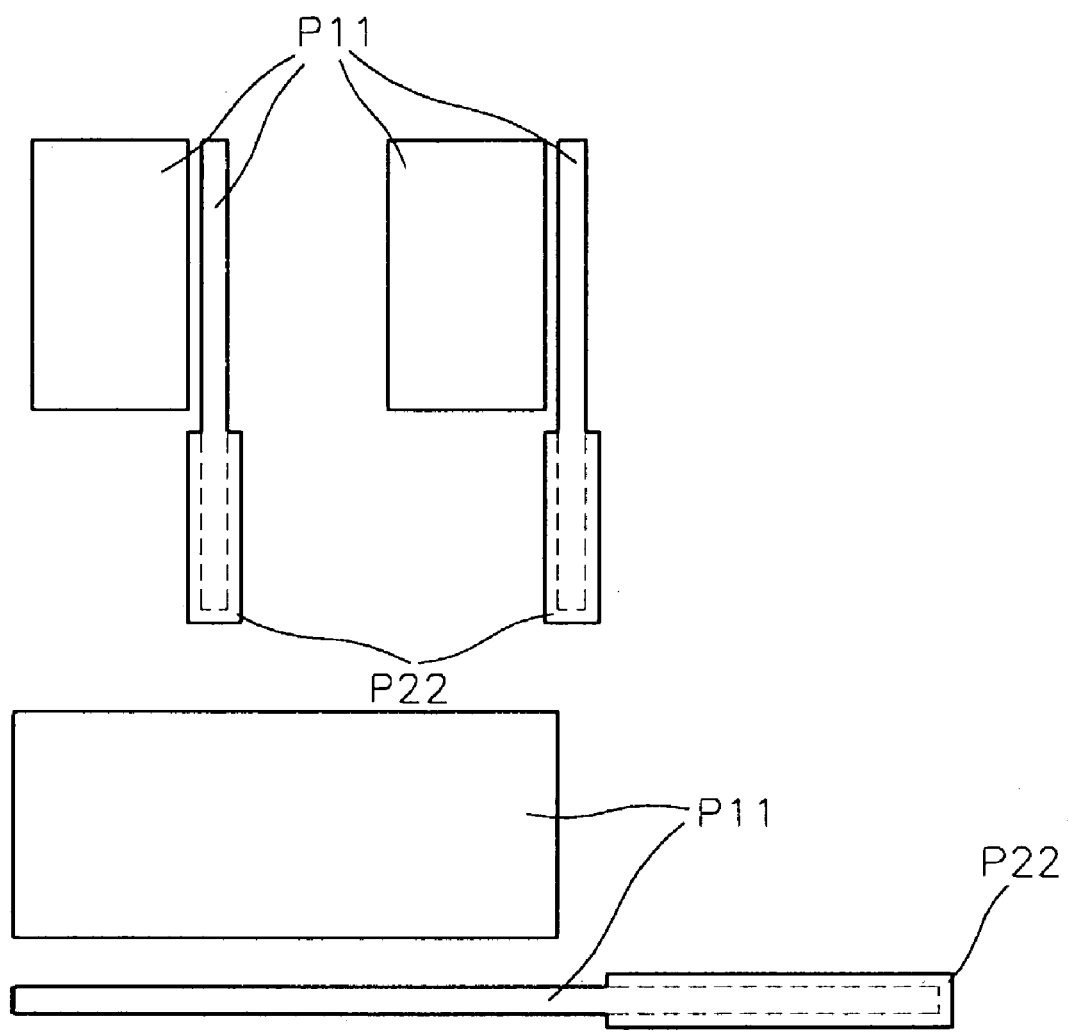
FIG. 2 is a plan view of an optical proximity correction (OPC) mask made by using a method for manufacturing an OPC mask with an electron beam according to one embodiment of the invention.
Figure 3A:
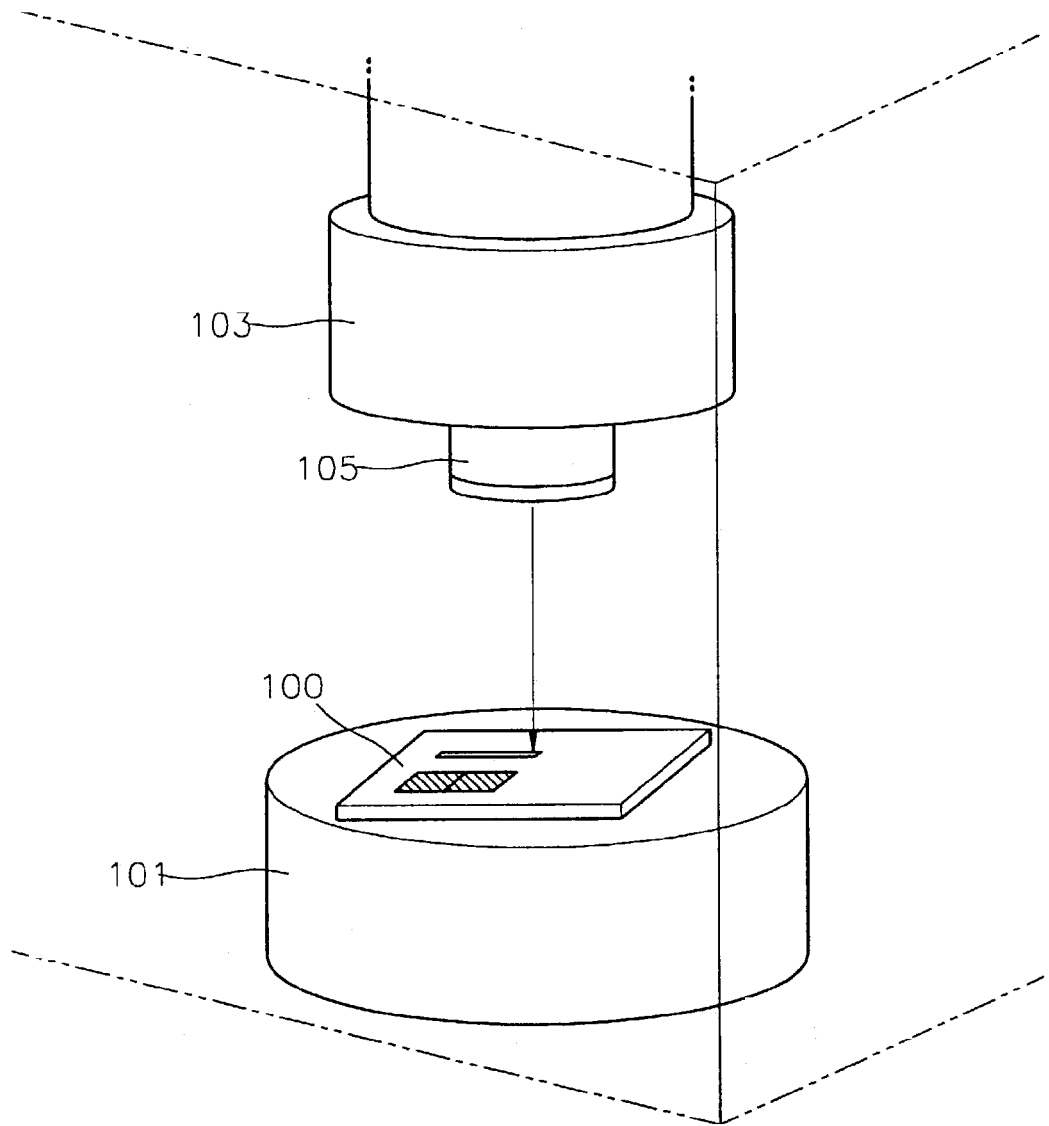
FIG. 3A is a schematic view of an apparatus used to manufacture an OPC mask with an electron beam.
Figure 3B:
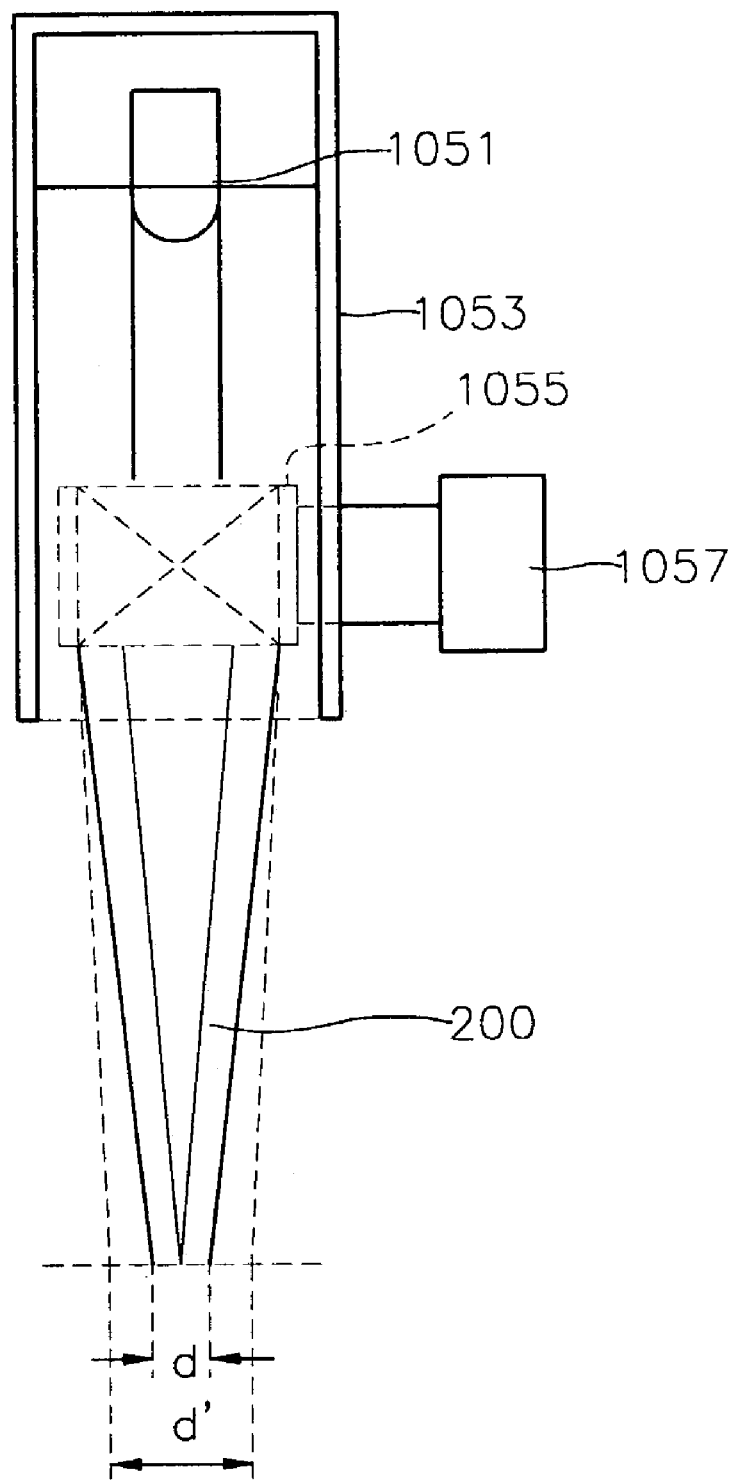
FIG. 3B is a schematic view of an electron beam illuminating unit included in the apparatus of FIG. 3A.

FIG. 2 is a plan view of a mask pattern made by a method for manufacturing an optical proximity correction (OPC) mask using an electron beam, according to the present invention. FIGS. 3A and 3B are schematic views of apparatuses for manufacturing a mask pattern on a mask using an electron beam.

Referring to FIG. 2, when a mask on which patterns are formed is placed on an alignment & exposure tool to transfer the patterns to a photoresist, interference of light between the patterns distorts certain patterns to be transferred in the exposure process. The distorted patterns can be corrected based on statistical values. As shown in FIGS. 2 and 3A, an OPC mask according to the present invention includes a mask body 100; an oblique layer (not shown) formed on the mask body 100; a desired pattern P11 formed on the light-shielding layer using an electron beam; and an amended pattern P22, adjacent to the desired pattern P11, formed to compensate for the kennel effect occurring in the pattern P11. The amended pattern P22 is obtained by defocusing the electron beam on the pattern P11 so that predetermined amendment is reflected in the pattern P11.

Referring to FIG. 3A, an apparatus for manufacturing an OPC mask with an electron beam, according to the present invention, includes a holder 101 that has a mask holding plate (not shown) for fixing the mask body 100, and an electron beam illuminator 103 that is formed on the holder 101 to illuminate an electron beam on the mask body 100. The electron beam illuminator 103 includes an electron beam illuminating unit 105.

Referring to FIG. 3B, the electron beam illuminating unit 105 includes an electric emitter 1051 that emits an electron beam, an electron beam guide tube 1053 that includes the electron emitter 1051 that emits electrons in the direction of the mask body 100, and an electron beam focusing unit 1055 that focuses the electron beam 200 to a predetermined size. The electron beam focusing unit 1055 includes an electron beam controlling unit 1057 that controls the diameter of the electron beam 200, and the electron beam controlling unit 1057 includes a controller (not shown) that calculates and compensates for the kennel effect occurring in a pattern. When the electron beam 200 is incident upon the mask body 100, the electron beam controlling unit 1057 controls the flux of the electron beam 200 in order to change the diameter of the electron beam 200.

Figure 3C:
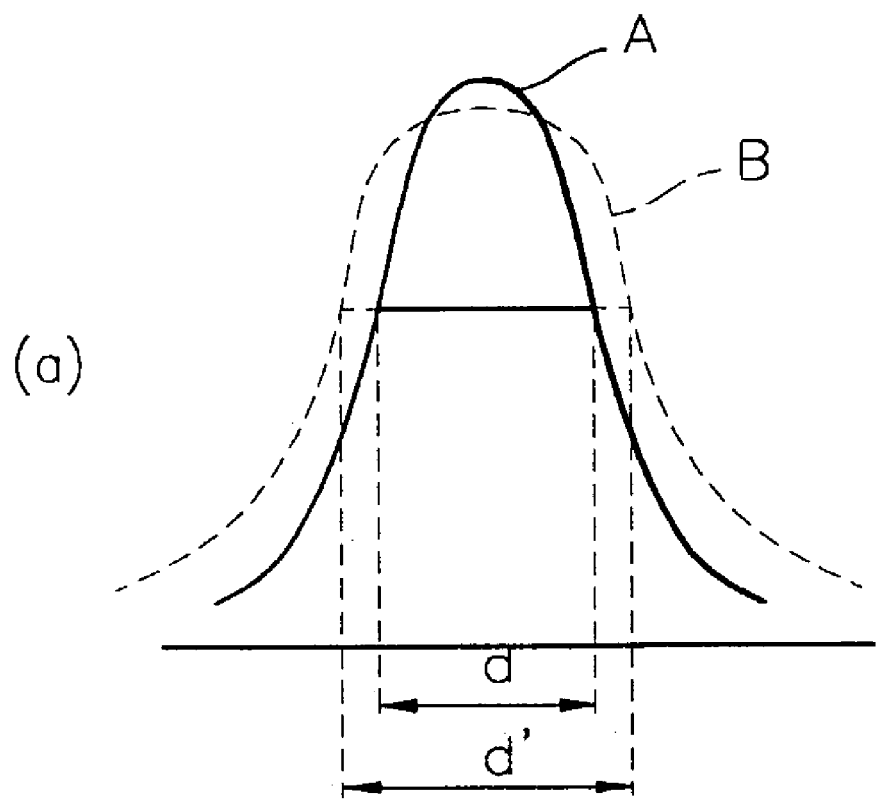
FIG. 3C (a) is a graph illustrating the difference between the intensity of a focused electron beam and that of a defocused electron beam in an apparatus for manufacturing an OPC mask with an electron beam.
Figure 3C:
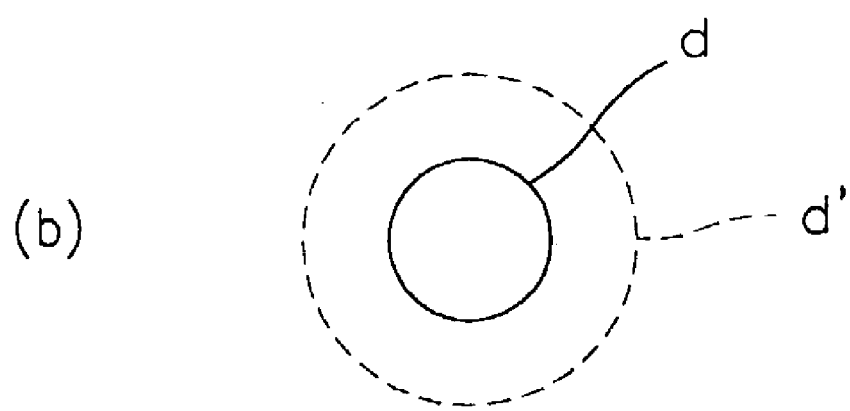

FIG. 3C(a) shows lines A and B illustrating the intensity profile for electron beams of two different diameters used in an apparatus for manufacturing a mask with an electron beam, and FIG. 3C(b) is a diagram illustrating the size of the electron beams. More specifically, lines A and B illustrate the intensity of a focused electron beam and the intensity of an electron beam that is defocused to a predetermined extent. As is apparent from FIG. 3C(b), line A has a narrower intensity distribution (and greater peak intensity) than line B. In other words, a defocused electron beam has a larger diameter d', but a smaller peak intensity, than the diameter d of a focused electron beam, as shown in FIG. 3C(b).

Figure 4A:
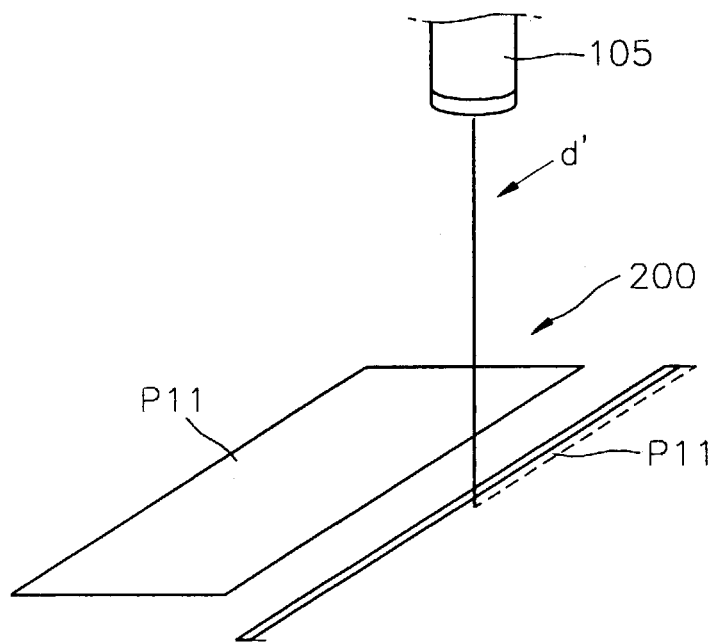
FIG. 4A is a diagram illustrating a method of forming a desired pattern by changing the size of an electron beam.
Figure 4B:
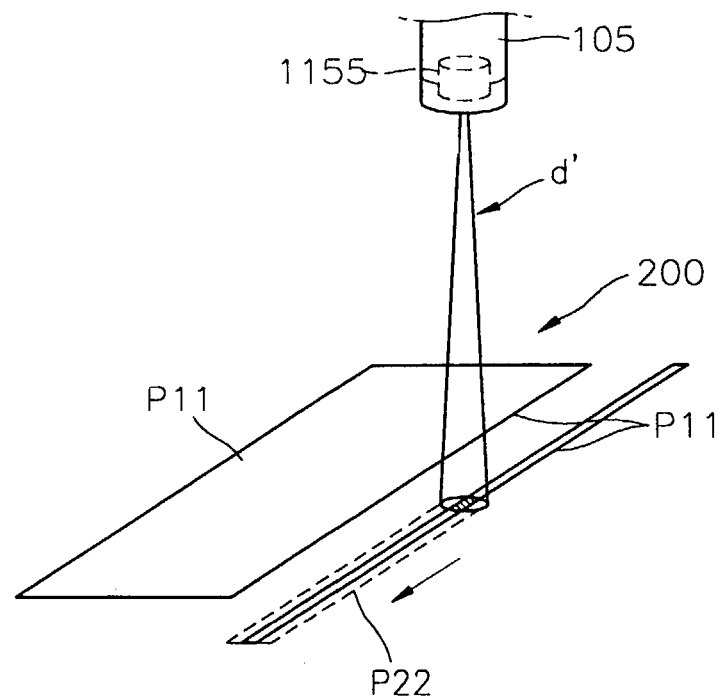
FIG. 4B is a diagram illustrating a method of forming an amended pattern by changing the size of an electron beam.

FIGS. 4A and 4B are diagrams illustrating two different methods of forming a pattern on a mask body using an electron beam. Specifically, FIG. 4A illustrates a method of forming a pattern in which the Kennel Effect does not occur, and FIG. 4B illustrates a method of forming a pattern in consideration of the Kennel Effect.

As shown in FIGS. 4A and 4B, desired patterns P11 are formed with a focused electron beam of width d with a normal depth of focus in a pattern region where the Kennel Effect does not occur. However, in a pattern region P22 where the Kennel Effect occurs, the electron beam of width d is defocused to a predetermined extent so that the width d' of the defocused electron beam is the same as a critical dimension of the pattern region, and the defocused electron beam of width d' illuminates the mask body 200 to make amended patterns P22. In other words, the desired patterns P11 are formed using a normally focused electron beam of width d in the pattern region where the Kennel Effect does not occur. However, the amended patterns P22 are formed by defocusing the electron beam of width d to a defocused electron beam of width d' in a pattern area where the Kennel Effect occurs, i.e., when it is required to increase the width d of the desired pattern P11 to a width d'.

Figure 5A:
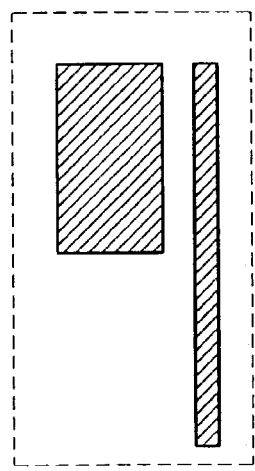
FIG. 5A is a schematic view of factors used to compensate for the Kennel Effect.
Figure 5A:
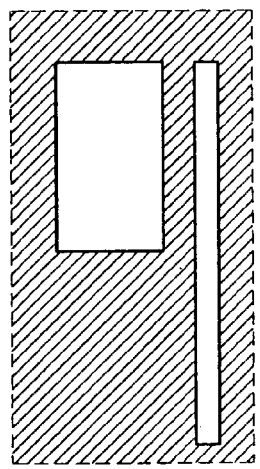
Figure 5A:
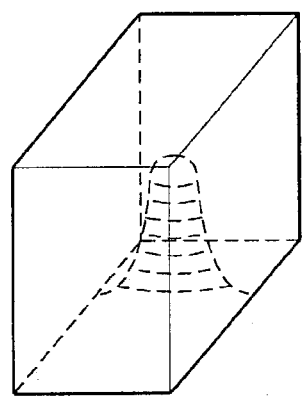
Figure 5B:
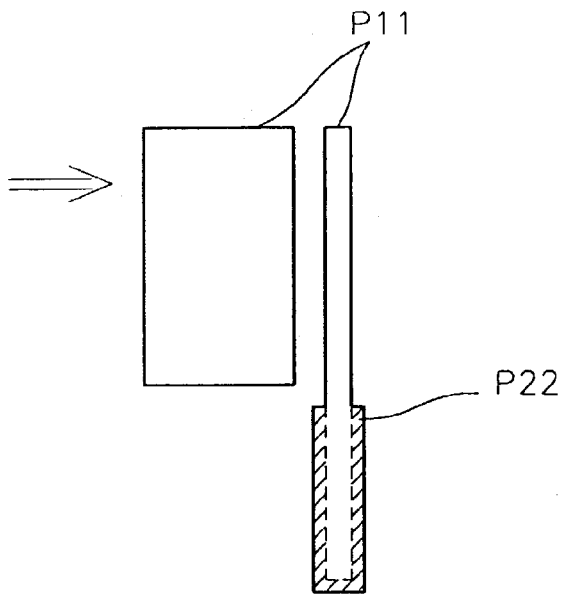
FIG. 5B illustrates an amended pattern formed on an OPC mask in which the Kennel Effect is compensated for, and the actual photoresist pattern that results from the amended pattern.
Figure 5B:
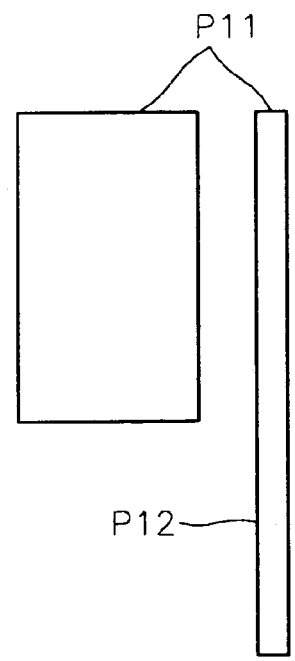

FIG. 5A is a schematic view of factors used to amend the Kennel Effect. FIG. 5B(a) is a plan view of an amended pattern, in which the Kennel Effect is amended, formed on an OPC mask, and FIG. 5B(b) is a plan view of the photoresist pattern obtained when performing a photolithography process on the amended pattern shown in FIG. 5B(a). The amended pattern of FIG. 5B(a) is obtained by combining the desired pattern of FIG. 5A(a) with the reverse pattern of FIG. 5A(b), and then, multiplying the combination by a pattern that is formed in consideration of the Kennel Effect, represented by FIG. 5A(c).

When a pattern is transferred onto a photoresist using a mask on which the amended pattern of FIG. 5B(a) is formed, the pattern obtained after the photolithography process is the same as the desired pattern shown in FIG. 5B(b), regardless of the Kennel Effect.

As described above, according to a method for manufacturing an OPC mask in accordance with one embodiment of the invention, an amended pattern is easily formed by defocusing an electron beam to increase the size of the electron beam so that it is equivalent to a critical dimension of a pattern in a pattern region where the Kennel Effect occurs. Thus, it is possible to easily obtain an amended pattern, which is formed in consideration of the Kennel Effect, without using a machine-readable file containing an amended pattern. In this case, the amended pattern can be made without overloading the memory capacity of a central processing unit (CPU) of an apparatus for manufacturing an OPC mask with an electron beam. Therefore, complicated patterns can easily be formed.

An apparatus and method for manufacturing an OPC mask with an electron beam, according to the present invention, includes an electron beam focusing unit for defocusing an electron beam and an electron beam controlling unit. Complicated amended patterns are quickly and easily formed in consideration of a Kennel Effect by changing the size of an electron beam to a desired extent when manufacturing an OPC mask. It is not required to store an additional amended pattern, thus, the memory of a CPU of this apparatus is not overloaded. Furthermore, according to this method, an amended pattern is formed by defocusing an electron beam in a pattern area where the Kennel Effect occurs. That is, a desired pattern and an amended pattern can be formed at the same by using a single machine-readable file, thereby reducing the manufacturing costs.

The invention claimed is:

1. A method for manufacturing an optical proximity correction (OPC) mask with an electron beam, the method comprising:
    placing a mask on a holder;
    illuminating the mask with the electron beam to form a mask pattern for a photolithography process on the mask, wherein illuminating the mask includes
    forming a desired pattern on the mask, and
    forming an amended pattern in consideration of a Kennel Effect by changing the size of the electron beam in a portion of the desired pattern where the Kennel Effect occurs a critical dimension of the amended pattern corresponding to a required size of the electron beam.

2. The method of claim 1, wherein forming a desired pattern on the mask comprises:
    preparing a machine-readable file that stores information regarding the desired pattern; and
    illuminating the mask with the electron beam according to the information contained in the machine-readable file.

3. The method of claim 2, wherein forming a desired pattern on the mask further comprises:
    linearly illuminating, with the electron beam, a portion of the mask where the desired pattern is to be formed.

4. The method of claim 2, wherein the desired pattern is the same as a pattern to be formed on a semiconductor substrate after a photolithography process.

5. The method of claim 1, wherein forming an amended pattern in consideration of a Kennel Effect by changing the size of the electron beam in a portion of the desired pattern where the Kennel Effect occurs further comprises defocusing the electron beam.

6. The method of claim 5, wherein defocusing the electron beam further comprises adjusting a depth of focus of the electron beam.

7. The method of claim 6, further comprising adjusting a diameter of the electron beam with an electron beam focusing unit.

8. The method of claim 7, wherein adjusting a depth of focus of the electron beam and adjusting a diameter of the electron beam further comprises applying a voltage to the electron beam focusing unit to adjust a focal point of the electron beam.

9. The method of claim 6, wherein the amended pattern formed in consideration of the Kennel Effect is an isolated linear pattern.

10. An Optical Proximity Correction (OPC) mask for a photolithography process, the OPC mask comprising:
    a mask body having a substantially circular shape and coated with a light-shielding layer;
    a desired pattern disposed on the light-shielding layer; and
    an amended pattern disposed on the light-shielding layer and around the desired pattern in a pattern area where a Kennel effect occurs, a critical dimension of the amended pattern corresponding to a required size of an electron beam, the required size of the electron beam calculated according to coefficients obtained in consideration of the Kennel effect.

11. The OPC mask of claim 10, wherein the amended pattern is formed by defocusing an electron beam used to make the desired pattern.

12. The OPC mask of claim 10, wherein the amended pattern is used mainly to make a fine linear pattern.

13. An apparatus for manufacturing an OPC mask with an electron beam, the apparatus comprising:
- a holder structured to support a mask body;
- an electron beam illuminator disposed on a central upper portion of the holder, wherein the electron beam illuminator includes an electron beam source structured to generate the electron beam that illuminates the mask body, an electron beam focusing unit structured to focus the electron beam, and an electron beam controlling unit to defocus the electron beam by changing a depth of focus of the electron beam; and
- a controller mounted on the electron beam illuminator, the controller structured to calculate a required size of the electron beam according to coefficients obtained in consideration of the Kennel Effect the required size of the electron beam corresponding to a critical dimension of an amended pattern formed in consideration of the Kennel Effect, the controller further structured to command the electron beam controlling unit based on the calculation result to change the size of the electron beam.

14. A method for manufacturing an optical proximity correction (OPC) mask with an electron beam comprising:
placing a mask on a holder; and
forming a mask pattern for a photolithography process on the mask by illuminating the mask with an electron beam, wherein forming a mask pattern further comprises
forming a desired pattern on the mask; and
forming an amended pattern in consideration of a Kennel Effect by defocusing the electron beam in a portion of the desired pattern where the Kennel Effect occurs so that the size of the electron beam is equivalent to a critical dimension of a pattern formed in the pattern area in which the Kennel Effect occurs.

15. The method of claim 14, wherein defocusing the electron beam further comprises adjusting a depth of focus of the electron beam.

16. The method of claim 15, further comprising adjusting a diameter of the electron beam with an electron beam focusing unit.

17. The method of claim 16, wherein adjusting a depth of focus of the electron beam and adjusting a diameter of the electron beam further comprises applying a voltage to the electron beam focusing unit to adjust a focal point of the electron beam.

18. The method of claim 15, wherein the amended pattern formed in consideration of the Kennel Effect is an isolated linear pattern.

19. An apparatus for manufacturing an OPC mask with an electron beam, the apparatus comprising:
- a holder on which a mask body is placed;
- an electron beam illuminator formed on a central upper portion of the holder, wherein the electron beam illuminator comprises an electron beam source to generate the electron beam that illuminates the mask body, an electron beam focusing unit to focus the electron beam, an electron beam controlling unit to defocus the electron beam by changing a depth of focus of the electron beam; and
- a controller mounted on the electron beam illuminator that calculates a required size of the electron beam according to coefficients obtained in consideration of the Kennel effect and commands the electron beam controlling unit based on the calculation result, wherein the required size of the electron beam corresponds to a critical dimension of an amended pattern formed in consideration of the Kennel effect.

20. The method of claim 14, wherein forming a desired pattern on the mask comprises:
preparing a machine-readable file that stores information regarding the desired pattern; and
illuminating the mask with the electron beam according to the information contained in the machine-readable file.

21. The method of claim 20, wherein forming a desired pattern on the mask further comprises:
linearly illuminating, with the electron beam, a portion of the mask where the desired pattern is to be formed.

22. The method of claim 20, wherein the desired pattern is the same as a pattern to be formed on a semiconductor substrate after a photolithography process.

* * * * *

UNITED STATES PATENT AND TRADEMARK OFFICE
CERTIFICATE OF CORRECTION

PATENT NO. : 7,065,735 B2
APPLICATION NO. : 10/401856
DATED : June 20, 2006
INVENTOR(S) : Won-Tai Kim et al.

Page 1 of 1

It is certified that error appears in the above-identified patent and that said Letters Patent is hereby corrected as shown below:

Column 6, line 17, the words "occurs a" should read -- occurs, a --;
Column 7, line 15, the word "Effect" should read -- Effect, --.

Signed and Sealed this

Eleventh Day of August, 2009

David J. Kappos
*Director of the United States Patent and Trademark Office*